(12) United States Patent
Sunwoo et al.

(10) Patent No.: US 9,503,124 B2
(45) Date of Patent: Nov. 22, 2016

(54) METHOD AND APPARATUS FOR DECODING LOW-DENSITY PARITY-CHECK CODE

(71) Applicant: AJOU UNIVERSITY INDUSTRY-ACADEMIC COOPERATION FOUNDATION, Suwon-si, Gyeonggi-do (KR)

(72) Inventors: Myung Hoon Sunwoo, Seoul (KR); Byung Jun Choi, Seoul (KR)

(73) Assignee: Ajou University Industry-Academic Cooperation Foundation, Suwon-si, Gyeonggi-do (KR)

( * ) Notice: Subject to any disclaimer, the term of this patent is extended or adjusted under 35 U.S.C. 154(b) by 118 days.

(21) Appl. No.: 14/537,571

(22) Filed: Nov. 10, 2014

(65) Prior Publication Data

US 2015/0303944 A1    Oct. 22, 2015

(30) Foreign Application Priority Data

Apr. 22, 2014    (KR) ..................... 10-2014-0048251

(51) Int. Cl.
 *H03M 13/00*    (2006.01)
 *H03M 13/11*    (2006.01)

(52) U.S. Cl.
 CPC ..... *H03M 13/1131* (2013.01); *H03M 13/1117* (2013.01); *H03M 13/6502* (2013.01)

(58) Field of Classification Search
 CPC .................. H03M 13/1131; H03M 13/1117; H03M 13/6502
 See application file for complete search history.

(56) References Cited

U.S. PATENT DOCUMENTS

| | | | | |
|---|---|---|---|---|
| 6,633,856 B2* | 10/2003 | Richardson | ............. | G06N 3/02 341/107 |
| 7,133,853 B2* | 11/2006 | Richardson | ............. | G06N 3/02 706/15 |
| 7,908,541 B2* | 3/2011 | Kyung | ................ | H03M 13/11 714/752 |
| 8,006,172 B2* | 8/2011 | Boyer | ............... | H03M 13/1105 714/786 |
| 8,196,005 B2* | 6/2012 | Kienle | .............. | H03M 13/1165 714/752 |
| 8,261,152 B2* | 9/2012 | Myung | ............. | H03M 13/1185 714/752 |
| 9,130,589 B2* | 9/2015 | Li | ....................... | H03M 13/1111 |
| 9,252,811 B2* | 2/2016 | Gioulekas | .......... | H03M 13/036 |

FOREIGN PATENT DOCUMENTS

| | | |
|---|---|---|
| JP | 2013-207358 A | 10/2013 |
| KR | 10-2009-0072972 A | 7/2009 |

OTHER PUBLICATIONS

Disclosure made by the inventors, Myung Hoon Sunwoo and Byung Jun Choi. "Efficient Forced Convergence Algorithm for Low Power LDPC Decoders" Disclosed at International SoC Design Conference on Nov. 19, 2013.

Ernesto Zimmermann et al., "Reduced Complexity LDPC Decoding using Forced Convergence", Sep. 2004.

* cited by examiner

*Primary Examiner* — Esaw Abraham
(74) *Attorney, Agent, or Firm* — Novick, Kim & Lee, PLLC; Sang Ho Lee

(57) ABSTRACT

Provided is a method of decoding a low-density parity-check code (LDPC). The decoding method including an initialization process, a check node update process, a variable node update process, a tentative decoding process, and a parity check process, for a plurality of check nodes and a plurality of variable nodes, further includes detecting at least one inactive variable nodes that do not require variable node update among the variable nodes, the variable node update process is performed only on active variable nodes except for the inactive variable node, and the check node update process is performed without using the inactive variable node.

12 Claims, 4 Drawing Sheets

METHOD AND APPARATUS FOR DECODING LOW-DENSITY PARITY-CHECK CODE

CROSS-REFERENCE TO RELATED PATENT APPLICATION

This application claims the benefit of Korean Patent Application No. 10-2014-0048251, filed on Apr. 22, 2014, in the Korean Intellectual Property Office, the disclosure of which is incorporated herein in its entirety by reference.

BACKGROUND OF THE INVENTION

1. Field of the Invention

The present invention relates to a decoding calculation, and more particularly, to a method and apparatus for decoding a low-density parity-check code (LDPC).

2. Description of the Related Art

Recently, as communication technologies have been rapidly developed and encoding for higher efficiency has been demanded, a low-density parity-check code (LDPC) has been on the rise.

LDPC encoding exhibits error correction capability closest to the channel capacity limit announced by Shannon along with turbo encoding among error correction technologies, has been currently selected and used in the recent communication system standard such as Wi-fi (IEEE 802.11n, 802.11ac), Wigig (IEEE 802.11 ad), 10Gbase-T Ethernet (802.3an), etc., and has been actively discussed to be selected as next-generation forward error correction encoding.

However, LDPC encoding requires high computational load for decoding despite high error correction capability, and thus there has been a need for an effective decoding method for reducing computational complexity.

SUMMARY OF THE INVENTION

The present invention provides a method and apparatus for decoding a low-density parity-check code (LDPC) for reducing computational complexity while minimizing reduction in bit error rate performance.

According to an aspect of the present invention, there is provided a method of decoding a low-density parity-check code (LDPC) including an initialization process, a check node update process, a variable node update process, a tentative decoding process, and a parity check process, for a plurality of check nodes and a plurality of variable nodes, wherein the method further includes detecting at least one inactive variable nodes that do not require variable node update among the variable nodes, the variable node update process is performed only on active variable nodes except for the inactive variable node, and the check node update process is performed without using the inactive variable node.

The check node update process may be performed using a less number of active variable nodes as a number of times of the check node update is increased.

The variable node update process is performed only on a less number of active variable nodes as a number of times of the variable node update is increased.

The check node update process may update the check-variable message using only the active variable nodes except for the inactive variable node and the $j^{th}$ variable node during updating of a check-variable message transmitted to the $j^{th}$ variable node by an $i^{th}$ check node The check node update process may be performed according to Expression 9 below:

$$\alpha_{ij} = \left\{ \prod_{j' \in V(i) \setminus j} \text{sign}(\beta_{ij'}) \right\} \times \min_{j' \in V(i) \setminus \{j,k\}} (|\beta_{ij''}|) \quad \text{[Expression 9]}$$

where $\alpha_{ij}$ represents a check-variable message transmitted to a $j^{th}$ variable node by an $i^{th}$ check node, $V(i) \setminus j$ represents a set of the remaining variable nodes except for the $j^{th}$ variable node connected to the $i^{th}$ check node, $V(i) \setminus \{j,k\}$ represents a set of the remaining variable nodes except for a $j^{th}$ variable node connected to an $i^{th}$ check node and a $k^{th}$ variable node as an inactive variable node, $\beta_{ij'}$ is a variable-check message that is transmitted to an $i^{th}$ check node by the remaining variable nodes except for a $j^{th}$ variable node, and $\beta_{ij''}$ represents a variable-check message transmitted to an $i^{th}$ check node by the remaining variable nodes except for a $j^{th}$ variable node and a $k^{th}$ variable node as an inactive variable node.

The detecting of the at least one inactive variable node may be performed based whether a forced convergence condition is satisfied.

According to another aspect of the present invention, there is provided an apparatus for decoding a low-density parity-check code (LDPC) including an initialization unit for performing initialization, a check node updating unit for performing check node update, a variable node updating unit for performing variable node update, a tentative decoding unit for performing tentative decoding, and a parity checking unit for performing parity check, on a plurality of check nodes and a plurality of variable nodes, wherein the apparatus further includes an inactive node detector for detecting at least one inactive variable nodes that do not require variable node update among the variable nodes, the variable node updating unit performs the variable node update only on active variable nodes except for inactive variable node, and the check node updating unit perform the check node update without using the inactive variable node.

The check node updating unit may perform the check node update using a less number of active variable nodes as a number of times of the check node update is increased.

The variable node updating unit may perform the variable node update only on a less number of active variable nodes as a number of times of the variable node update is increased.

The check node updating unit may update the check-variable message using only the active variable nodes except for the inactive variable node and the $j^{th}$ variable node during updating of a check-variable message transmitted to the $j^{th}$ variable node by an $i^{th}$ check node.

The check node updating unit may perform the check node update according to Expression 9 below:

$$\alpha_{ij} = \left\{ \prod_{j' \in V(i) \setminus j} \text{sign}(\beta_{ij'}) \right\} \times \min_{j' \in V(i) \setminus \{j,k\}} (|\beta_{ij''}|) \quad \text{[Expression 9]}$$

where $\alpha_{ij}$ represents a check-variable message transmitted to a $j^{th}$ variable node by an $i^{th}$ check node, $V(i) \setminus j$ represents a set of the remaining variable nodes except for the $j^{th}$ variable node connected to the $i^{th}$ check node, $V(i) \setminus \{j,k\}$ represents a set of the remaining variable nodes except for a $j^{th}$ variable node connected to an $i^{th}$ check node and a $k^{th}$ variable node as an inactive variable node, $\beta_{ij'}$ is a variable-check message that is transmitted to an $i^{th}$ check node by the remaining variable nodes except for a $j^{th}$ variable node, $\beta_{ij''}$ and represents a variable-check message transmitted to an $i^{th}$ check node by the remaining variable nodes except for a $j^{th}$ variable node and a $k^{th}$ variable node as an inactive variable node.

The inactive node detector may detect the at least one inactive variable node based whether a forced convergence condition is satisfied.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
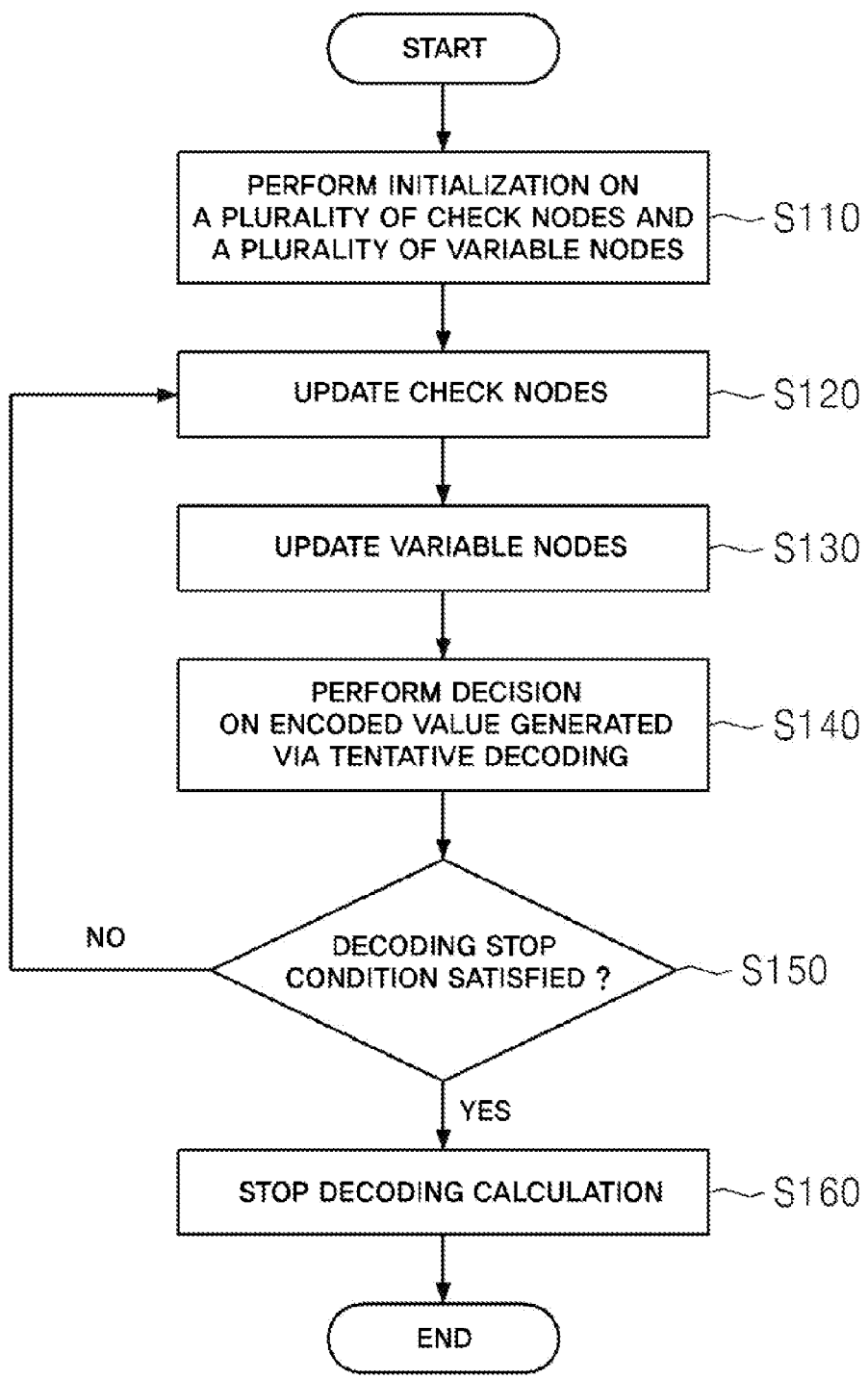
FIG. 1 is a flowchart for explaining a low-density parity-check code (LDPC) variable node update conventional min-sum algorithm.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the drawings, like reference numerals refer to like elements throughout.

The terms such as "first", "second", "A", "B", etc. are used herein merely to describe a variety of constituent elements, but the constituent elements are not limited by the terms. The terms are used only for the purpose of distinguishing one constituent element from another constituent element. For example, a first element may be termed a second element and a second element may be termed a first element without departing from the teachings of the present invention. As used herein, the term "and/or" includes any and all combinations of one or more of the associated listed items.

It will be understood that when an element, such as a layer, a region, or a substrate, is referred to as being "on", "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" or "has" used herein specify the presence of stated features, integers, steps, operations, members, components, and/or groups thereof, but do not preclude the presence or addition of one or more other features, integers, steps, operations, members, components, and/or groups thereof.

Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made in detail to the exemplary embodiments of the present invention with reference to the accompanying drawings.

FIG. 1 is a flowchart for explaining a low-density parity-check code (LDPC) variable node update conventional min-sum algorithm.

In this case, the LDPC decoding method may be performed using a parity check matrix H and a Tanner graph and the parity check matrix H may be represented as the Tanner graph. Check nodes are formed by as much as the number of rows in a parity check matrix and variable nodes are formed by as much as the number of columns to form the Tanner graph. When an element (i, j) of a matrix is 1, an $i^{th}$ check node and a $j^{th}$ variable node are connected by an edge and are neighboring nodes.

In operation 110, a decoding apparatus performs initialization in a plurality of check nodes and a plurality of variable nodes.

In detail, initialization is performed in the check nodes according to Expression 1 below.

$$\alpha_{ij} = 0 \qquad \text{[Expression 1]}$$

In this case, $\alpha_{ij}$ represents a check-variable message that is transmitted to a $j^{th}$ variable node by an $i^{th}$ check node, and an initial value of the check-variable message is set to 0 to initialize the check nodes.

Then initialization is performed in the variable nodes according to Expression 2 below.

$$\beta_{ij} = \lambda_j \qquad \text{[Expression 2]}$$
$$\lambda_j = \frac{2y_i}{\sigma^2}$$

$\beta_{ij}$ represents a variable-check message transmitted to an $i^{th}$ check node by a $j^{th}$ variable node, and an initial value of the check-variable message is set to $\lambda_j$ to initialize the variable nodes. In this case, $\lambda_j$ is induced as posterior possibility according to Expression 2 below when possibility distribution is an input symbol is uniform in an additive white Gaussian noise (AWGN) channel, $y_j$ represents a message value corresponding a $j^{th}$ bit of a received code word, and $\sigma^2$ represents noise variance.

In operation 120, the decoding apparatus updates the check nodes.

In more detail, the check nodes perform update according to Expression 3 below.

$$\alpha_{ij} = \left\{ \prod_{j' \in V(i) \setminus j} \text{sign}(\beta_{ij'}) \right\} \times \min_{j' \in V(i) \setminus j} (|\beta_{ij'}|) \quad \text{[Expression 3]}$$

In this case, $\alpha_{ij}$ represents a check-variable message transmitted to a $j^{th}$ variable node by an $i^{th}$ check node, $V(i) \setminus j$ represents a set of the remaining variable nodes except for a $j^{th}$ variable node connected to the $i^{th}$ check node, and $\beta_{ij'}$ represents a variable-check message transmitted to an $i^{th}$ check node by the remaining variable nodes except for a $j^{th}$ variable node.

That is, according to Expression 3 above, a sign of $\alpha_{ij}$ is determined to be negative or positive by multiplying a sign of variable-check messages by the remaining variable nodes except for a $j^{th}$ variable node connected to an $i^{th}$ check node according to a first term, and a minimum value of variable-check messages $\beta_{ij'}$ transmitted to an $i^{th}$ check node by the remaining variable nodes except for a $j^{th}$ variable node is a message value of $\alpha_{ij}$ according to a second term.

In operation 130, the decoding apparatus updates the variable nodes.

In more detail, the variable nodes perform update according to Expression 4 below.

$$\beta_{ij} = \lambda_j + \sum_{i' \in C(j) \setminus i} \alpha_{i'j} \quad \text{[Expression 4]}$$

In this case, $\beta_{ij}$ represents a variable-check message transmitted to an $i^{th}$ check node by a $j^{th}$ variable node, $\lambda_j$ represents an initial value of the variable-check message, $C(j) \setminus i$ represents a set of the remaining check nodes except for an $i^{th}$ check node connected to a $j^{th}$ variable node, and $\alpha_{i'j}$ represents check-variable messages transmitted to a $j^{th}$ variable node by the remaining check nodes except for an $i^{th}$ check node.

That is, according to Expression 4 above, $\beta_{ij}$ is calculated by summing a value obtained by summing check-variable messages $\alpha_{i'j}$ transmitted to a $j^{th}$ variable node by the remaining check nodes except for an $i^{th}$ check node and an initial value $\lambda_j$ of a variable-check message, through which the variable node performs update.

In operation 140, the decoding apparatus performs decision on a coded value generated via tentative decoding.

In more detail, a decision procedure for the tentative decoded value generated via the tentative decoding is performed according to Expressions 5 and 6 below.

First, a procedure for calculating the tentative decoded value is performed according to Expression 5 below.

$$z_j = \lambda_j + \sum_{i \in C(j)} \alpha_{ij} \quad \text{[Expression 5]}$$

In this case, $z_j$ represents a tentative decoded value generated via tentative decoding in a $j^{th}$ variable node, $\lambda_j$ represents an initial value of a variable-check message, and $C(j)$ represents a set of check nodes connected to a $j^{th}$ variable node.

That is, according to Expression 5 above, $z_j$ is calculated by summing a value obtained by summing check-variable messages $\alpha_{ij}$ transmitted to a $j^{th}$ variable node by all check nodes and an initial value $\lambda_j$ of a variable-check message.

Then decision for a tentative decoded value $z_j$ is performed according to Expression 6 below.

$$\hat{x}_j = \begin{cases} 1, & \text{if } z_j \leq 0 \\ 0, & \text{if } z_j > 0 \end{cases} \quad \text{[Expression 6]}$$

In this case, $\hat{x}_j$ represents a decision result value for a tentative decoded value and the decision result value $\hat{x}_j$ is determined based whether a sign of the tentative decoded value $z_j$ is negative or positive.

In operation 150, the decoding apparatus performs parity check to determine whether a decoding stop condition is satisfied.

In more detail, parity check is performed according to Expression 7 below.

$$\begin{cases} \hat{x}_j H^T = 0, & \text{then end decoding} \\ \hat{x}_j H^T \neq 0, & \text{then go back } CNU \end{cases} \quad \text{[Expression 7]}$$

That is, according to Expression 7 above, whether the decoding stop condition is satisfied is determined by determining whether $\hat{x}_j H^T$ obtained by multiplying a decision result value $\hat{x}_j$ by a matrix $H^T$ obtained by transposing a parity check matrix H is 0.

When the decoding stop condition is not determined to be satisfied, the method returns to a check node update (CNU) process of operation 120 and the check node update (CNU) process and a variable node update (VNU) process are performed again.

In operation 160, upon determining that the decoding stop condition is satisfied via parity check, the decoding apparatus stops decoding calculation including check node update and variable node update.

In an LDPC decoding method according to a conventional min-sum algorithm, when the decoding stop condition described with reference to FIG. 1 is not satisfied, check node unit update and variable node unit update need to be maintained until the decoding stop condition is satisfied, and thus a problem arises in terms of significantly high computational load.

Figure 2:
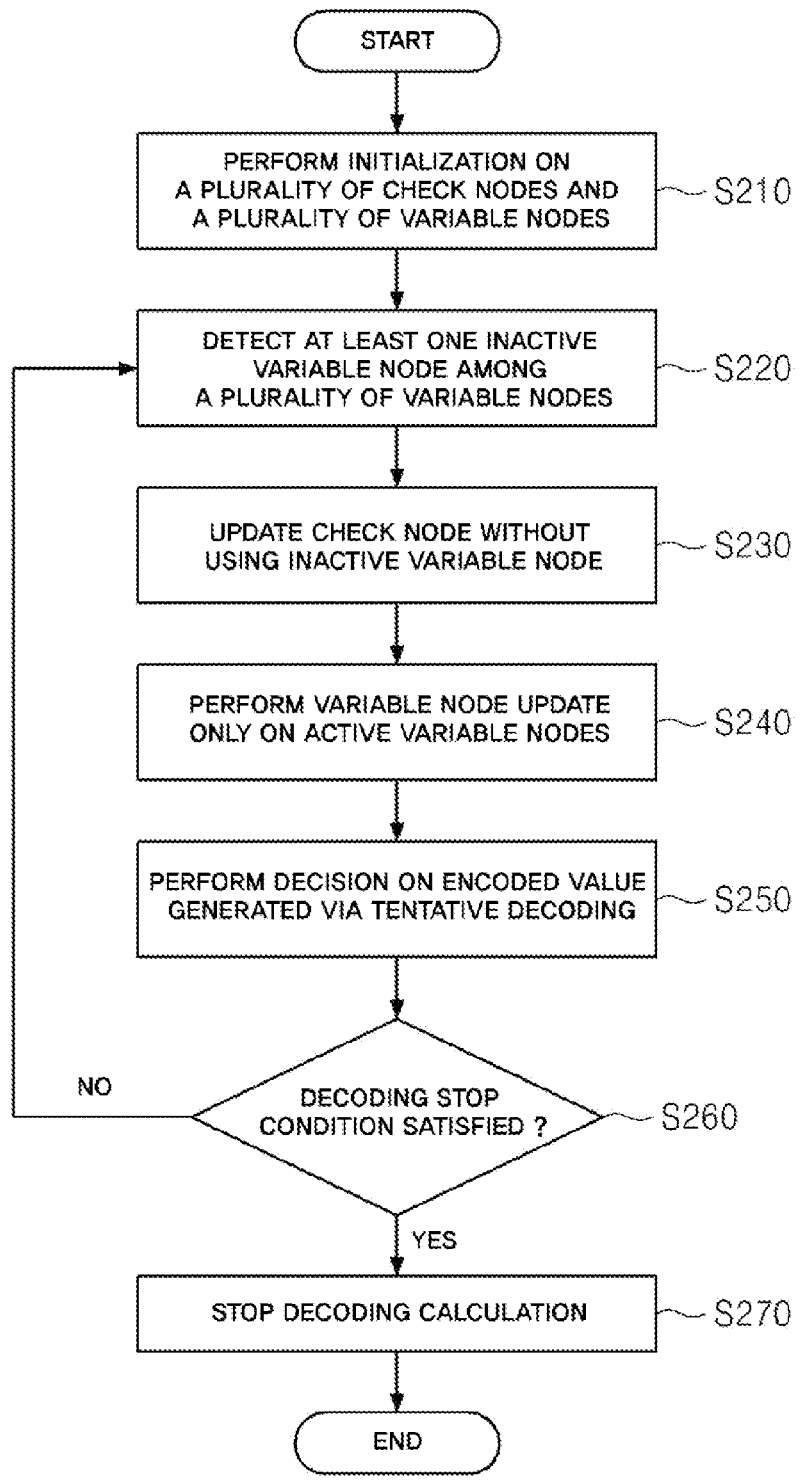
FIG. 2 is a flowchart for explaining an LDPC decoding method according to an embodiment of the present invention.

FIG. 2 is a flowchart for explaining an LDPC decoding method according to an embodiment of the present invention.

In operation 210, the decoding apparatus performs initialization in a plurality of check nodes and a plurality of variable nodes.

The initialization for the check node and variable node, performed in operation 210, is the same as in operation 110, and thus a detailed description thereof will be omitted herein. In addition, hereinafter, a detailed description of the same operations as in FIG. 1 will be omitted here.

In operation 220, the decoding apparatus detects at least one inactive variable node that does not require variable node update among a plurality of variable nodes.

In more detail, the inactive variable node may be performed according to Expression 8 below.

$$|z_j| > t_v \quad \text{[Expression 8]}$$

That is, in Expression 8 above, an absolute value of a tentative decoded value $z_j$ represents reliability corresponding a $j^{th}$ bit of a receive code word. In this regard, when the reliability of the message value corresponding to a $j^{th}$ bit of the code word is a threshold value $t_v$ or more, it is determined that the reliability converges into a high reliability value and a $j^{th}$ variable node is detected as the inactive variable node. Such a condition is referred to as a forced convergence condition, and when $z_j$ is a threshold value $t_v$ or more, it is determined that the forced convergence condition is satisfied, and a $j^{th}$ variable node is detected as the inactive variable node.

That is, a plurality of variable nodes determines that decoding has been already completed on variable nodes that converge into a high reliability value, based on the fact that the reliability value converges into a high reliability value after several number of times of iterative decoding and configures corresponding variable nodes as inactive nodes so as not to perform updating calculation in the remaining iterative decoding.

However, when an inactive variable node is detected immediately after initialization is performed on check nodes and variable nodes, the inactive variable node may not be present because iterative decoding has not been performed.

In operation 230, the decoding apparatus updates check nodes without using the inactive variable node.

In more detail, the decoding apparatus according to an embodiment of the present invention updates check nodes according to Expression 9 below.

$$\alpha_{ij} = \left\{ \prod_{j' \in V(i)\backslash j} \text{sign}(\beta_{ij'}) \right\} \times \min_{j'' \in V(i)\backslash \{j,k\}} (|\beta_{ij''}|) \qquad \text{[Expression 9]}$$

In this case, $\alpha_{ij}$ represents a check-variable message transmitted to a $j^{th}$ variable node by an $i^{th}$ check node, $V(i)\backslash j$ represents a set of the remaining variable nodes except for the $j^{th}$ variable node connected to the $i^{th}$ check node, $V(i)\backslash \{j,k\}$ represents a set of the remaining variable nodes except for a $j^{th}$ variable node connected to an $i^{th}$ check node and a $k^{th}$ variable node as an inactive variable node, $\beta_{ij'}$ is a variable-check message that is transmitted to an $i^{th}$ check node by the remaining variable nodes except for a $j^{th}$ variable node, and $\beta_{ij''}$ represents a variable-check message transmitted to an $i^{th}$ check node by the remaining variable nodes except for a $j^{th}$ variable node and a $k^{th}$ variable node as an inactive variable node.

That is, according to Expression 9 above, a sign of $\alpha_{ij}$ is determined to be negative or positive by multiplying a sign of variable-check messages by the remaining variable nodes except for a $j^{th}$ variable node connected to an $i^{th}$ check node according to a first term, and a minimum value of variable-check messages $\beta_{ij'}$ transmitted to an $i^{th}$ check node by the remaining variable nodes except for a $j^{th}$ variable node and a $k^{th}$ variable node as an inactive variable node is a message value of $\alpha_{ij}$ according to a second term.

In this case, when a number of times of iterative decoding is increased such that a number of times of check node update and variable node update is increased, the number of inactive variable nodes that satisfy the forced convergence condition is increased. Thus check node update is performed using a less number of active variable nodes whenever a number of times of iterative decoding is increased, and accordingly computational load according to check node update is reduced whenever a number of times of iterative decoding is increased.

According to a scheme of conventional technologies, in order to reduce computational load during check node update, whether a forced convergence condition is satisfied is also determined for check nodes, a check node that satisfies the forced convergence condition is configured as an inactive check node, and the check node update is not performed any more. As such, a scheme for reducing decoding computational load by inactivating both the check node and the variable node which satisfy the forced convergence condition based on whether both the check node and the variable node satisfy the forced convergence condition, forced convergence condition may be referred to as a forced convergence scheme.

The conventional forced convergence scheme uses a check node updating method and a variable node updating method in the min-sum algorithm of FIG. 1, determines whether a forced convergence condition is satisfied according to Expression 8 above to detect an inactive variable node, and detects an inactive check node according to Expression 10 below.

$$\min_{j \in V(i)} (|\beta_{ij}|) > t_c \qquad \text{[Expression 10]}$$

That is, when a variable-check message having a minimum value among variable-check messages $\beta_{ij}$ used to update an $i^{th}$ check node has a threshold value $t_c$ or more, the $i^{th}$ check node is detected as an inactive check node and check node update is not performed any more. When the $i^{th}$ check node does not satisfy the forced convergence condition of Expression 10, the check node update is continuously performed until the forced convergence condition is satisfied.

However, even if the conventional forced convergence scheme has reduced decoding computational load compared with the min-sum algorithm of FIG. 1, the reduced decoding computational load is very insignificant, as seen from Table 1 below, and thus it is hard to consider that decoding computational load is reduced in reality.

TABLE 1

| $t_v$ | SNR | | | | |
|---|---|---|---|---|---|
| | 2 dB | 2.5 dB | 3 dB | 3.5 dB | 4 dB |
| 5 | 0% | 0.002905% | 0.009067% | 0.015681% | 0.013738 |
| 6 | 0% | 0.000626% | 0.000848% | 0.001148% | 0.001498 |
| 7 | 0% | 0.000017% | 0.000279% | 0.000065% | 0.00041% |

Table 1 above shows the possibility that $\beta_{ij}$ greater than $t_v$ is selected as a minimum value during check node update calculation when a maximum number of times of iterative decoding is limited to 5. As shown in Table 1 above, when a signal to noise (SNR) is in the range of 2 dB to 4 dB, average selection possibility is 0.0082782% if $t_v$ is 5, average selection possibility is 0.000824% if $t_v$ is 6, and average selection possibility is 0.0000804% if $t_v$ is 7. As seen from Table 1 above, the selection possibility is equal to or less than about 0.01% under each condition. Thus it is seen that there is very low possibility that $\beta_{ij}$ that exceeds $t_v$ is selected as a minimum value.

When the forced convergence scheme is applied to the min-sum algorithm, $t_v$ of Expression 7 above and $t_c$ of Expression 10 above use the same value in general. When the very low possibility that $\beta_{ij}$ that exceeds $t_v$ is selected as a minimum value, this means that a minimum value of $\beta_{ij}$ of the check node update calculation barely exceeds $t_c$. This means that the forced convergence condition of Expression 10 above for determining whether the check nodes are inactivated is barely satisfied. That is, according to the forced convergence scheme, when a maximum number of times of iterative decoding is low, the number of inactivated check nodes is low, and thus, computational complexity of check nodes may not be effectively reduced.

However, according to an embodiment of the present invention, check nodes are partially inactivated to reduce computational load caused by check node update via a method of excluding inactive variable nodes from a minimum value candidate of $\beta_{ij}$ according to Expression 9 above during check node update without using a separate forced convergence condition for determining whether check nodes are inactivated. In this case, when all variable nodes connected to a check node are inactive variable node, the check node is an inactive check node.

That is, in the conventional forced convergence scheme, check node update calculation is performed using all variable nodes connected to a check node until the check node satisfies the forced convergence condition of Expression 10 above and becomes an inactive check node, thereby increasing computational load. However, according to an embodiment of the present invention, as a number of times of check node update calculation (a number of times of iterative decoding) is increased, the number of inactive variable nodes is increased, the number of active variable nodes used for check node update calculation is reduced, and thus computational complexity of the check node update calculation is gradually reduced.

Table 2 below shows a conventional forced convergence scheme and a decoding computational load reduction ratio according to the present invention, compared with the conventional min-sum algorithm.

TABLE 2

| Algorithm | $(t_v, t_c)$ | SNR = 2 dB Computational load reduction ratio | SNR = 3 dB Computational load reduction ratio | SNR = 4 dB Computational load reduction ratio |
|---|---|---|---|---|
| Min-sum algorithm | (-, -) | — | — | — |
| forced convergence scheme | (7, 7) | 0% | 0% | 0.1% |
| The present invention | (7, -) | 17.17% | 29.49% | 20.07% |

In Table 2 above, the min-sum algorithm does not use both $t_v$ and $t_c$, the forced convergence scheme uses both $t_v$ and $t_c$, the present invention uses only $t_v$, and $t_v$ and $t_c$ are configured as 7 and 7 and then computational load reduction ratios are compared.

Based on this, according to the forced convergence scheme, it is analyzed that computational load is barely reduced compared with the min-sum algorithm. In addition, as seen from Table 2 above, according to the present invention, when SNR is 2 dB, 3 dB, and 4 dB, a computational load reduction effect may be achieved by as much as 17.17%, 29.49%, and 20.08%, respectively, compared with the min-sum algorithm.

In addition, comparing bit error rate (BER) performance of the min-sum algorithm, the forced convergence scheme, and the present invention under the aforementioned condition, it is analyzed that there is barely BER performance difference therebetween. It may be seen from decoding computational load may be reduced while minimizing reduction in BER performance according to an embodiment of the present invention.

In operation 240, variable node update is performed only on active variable nodes except for an inactive variable node.

In this case, when a number of times of variable node update is increased such that the number of inactive variable nodes is increased, the number of active variable nodes is increased, and variable node update is performed only on a less number of active variable nodes whenever a number of times of variable node update is increased, thereby reducing decoding computational load.

However, when an inactive variable node detection is tried immediately after initialization is performed on check nodes and variable nodes, inactive the inactive variable node may not be present because iterative decoding has not been performed, and thus, an inactive variable node excluded from variable node update calculation may also not be present.

In operation 250, the decoding apparatus performs decision on an encoded value generated via tentative decoding.

In operation 260, the decoding apparatus perform parity check to determine whether the decoding stop condition is satisfied.

When it is determined that the decoding stop condition is not satisfied, the method returns to operation 220 and inactive variable node detection, check node update, and variable node update are re-performed.

In operation 270, upon determining whether the decoding stop condition is satisfied via parity check, the decoding apparatus stops decoding calculation including check node update and variable node update.

Figure 3:
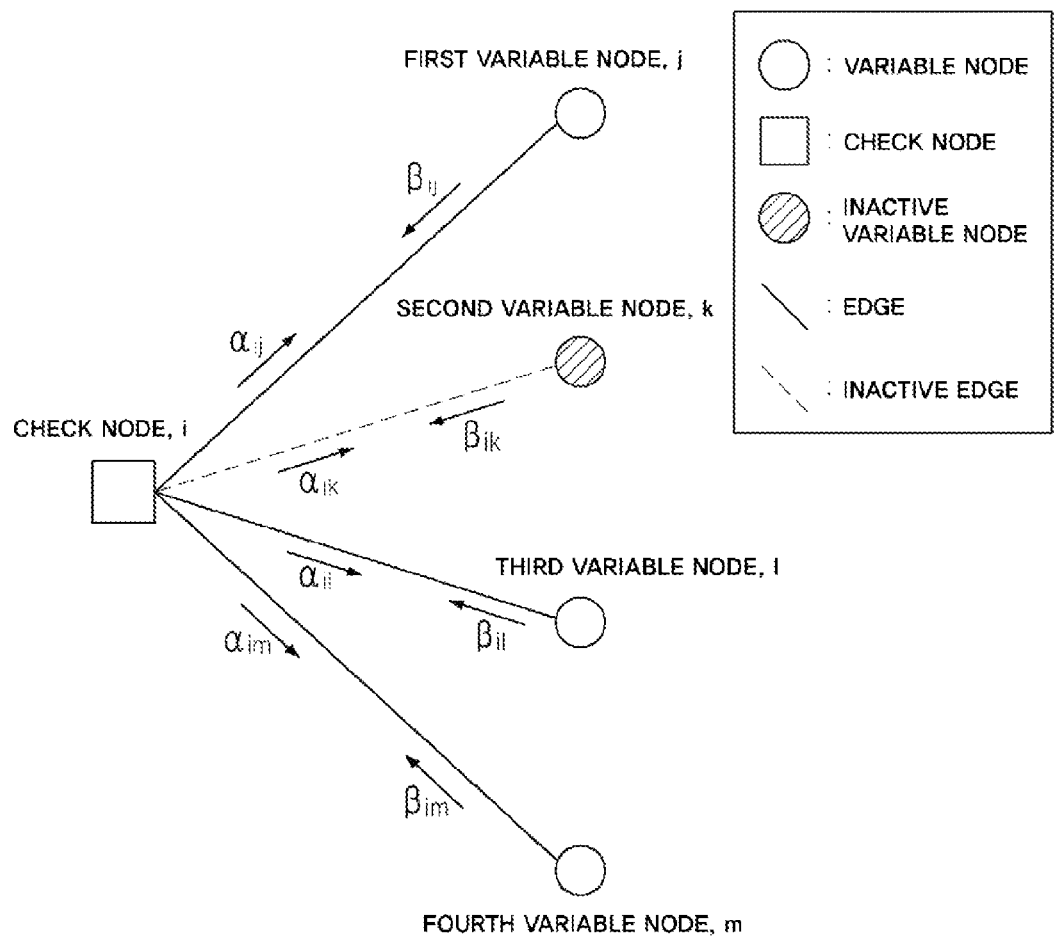
FIG. 3 is a diagram for explanation of a check node update method according to an embodiment of the present invention.

FIG. 3 is a diagram for explanation of a check node update method according to an embodiment of the present invention.

In FIG. 3, $j^{th}$, $l^{th}$, and $m^{th}$ variable nodes as active variable nodes are each indicated by a circular node, a $k^{th}$ variable node is indicated as an inactive variable node, and an $i^{th}$ check node is indicated as a tetragonal node. In addition, $j^{th}$, $l^{th}$, and $m^{th}$ variable nodes as active variable node and an $i^{th}$ check node are connected by an edge of a solid line, and a $k^{th}$ variable node as an inactive variable node and an $i^{th}$ check node are connected by an inactive edge of a dotted line.

Here, $\alpha_{ij}$, $\alpha_{ik}$, $\alpha_{il}$, and $\alpha_{im}$ are check-variable messages transmitted to variable nodes by check nodes, and $\beta_{ij}$, $\beta_{ik}$, $\beta_{il}$, and $\beta_{im}$ are variable-check messages transmitted to check nodes by variable nodes.

In FIG. 3, it is assumed that a $k^{th}$ variable node as an inactive variable node is determined as an inactive variable node because $|z_k|$ is greater than $t_v$ according to Expression 8 above.

In this case, according to an embodiment of the present invention, $\alpha_{ij}$ as one of resulting values of check node update calculation is calculated using only two values, that is, $\beta_{il}$ as a variable-check message transmitted to check nodes by an $i^{th}$ variable node and $\beta_{im}$ as a variable-check message transmitted to check nodes by an $m^{th}$ variable node. This is because the check node update calculation is performed according to Expression 9 above and $\beta_{ij}$ as a variable-check message transmitted to check nodes by a $j^{th}$ variable node and $\beta_{ik}$ as a variable-check message transmitted to check nodes by a $k^{th}$ variable node as an inactive variable node are excluded from the check node update calculation according to Expression 9 above.

Since a $k^{th}$ variable node is an inactive variable node, variable node update calculation is not required and thus an $i^{th}$ check node does not have to calculate check-variable message $\alpha_{ik}$ required for variable node update calculation of a $k^{th}$ variable node.

In short, according to an embodiment of the present invention, when an inactive variable node is present, a check node connected to the inactive variable node does not have to calculate a check-variable message to be transmitted to the inactive variable node and does not also have to consider a variable-check message to be transmitted to check nodes by the inactive variable node during the check node update calculation, and thus decoding computational load is reduced.

Figure 4:
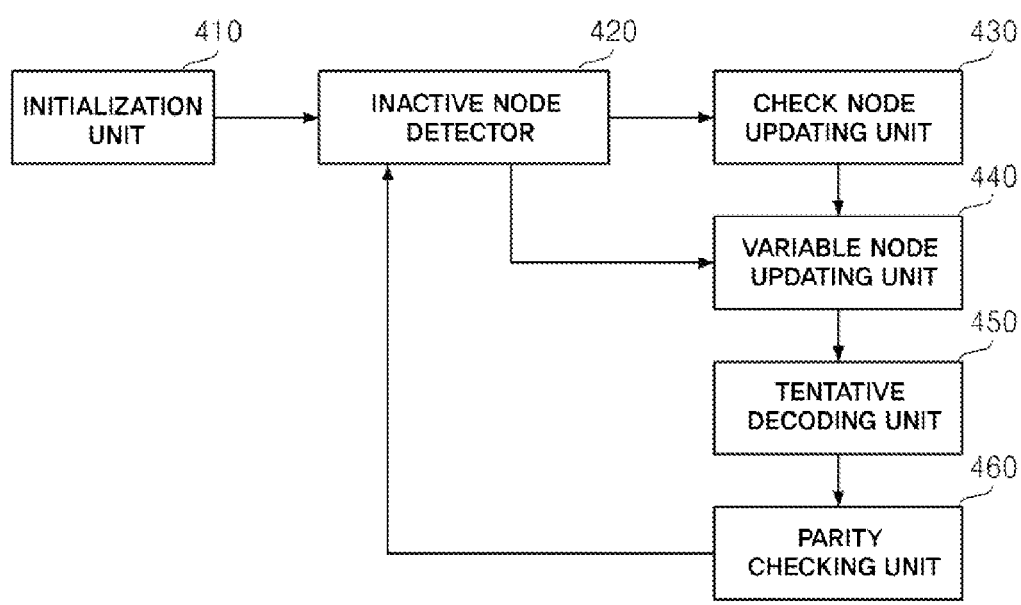
FIG. 4 is a diagram for explaining an LDPC decoding apparatus according to an embodiment of the present invention.

FIG. 4 is a diagram for explaining an LDPC decoding apparatus according to an embodiment of the present invention.

Referring to FIG. 4, an LDPC decoding apparatus according to an embodiment of the present invention includes an initialization unit 410, an inactive node detector 420, a check node updating unit 430, a variable node updating unit 440, a tentative decoding unit 450, and a parity checking unit 460.

The initialization unit 410 performs initialization on a plurality of check nodes and a plurality of variable nodes.

The inactive node detector 420 detects at least one inactive variable node that does not require variable node update among a plurality of variable nodes.

The check node updating unit 430 performs check node update without using the detected inactive variable node.

The variable node updating unit 440 updates variable nodes only for active variable nodes except for the detected inactive variable node.

The tentative decoding unit 450 performs decision on a decoded value generated via tentative decoding.

The parity checking unit 460 performs parity check and determines whether a decoding stop condition is satisfied.

In this case, upon determining whether the decoding stop condition is not satisfied, the parity checking unit 460 requests the inactive node detector 420 to detect an inactive variable node.

As such, the inactive node detector 420, the check node updating unit 430, the variable node updating unit 440, the tentative decoding unit 450, and the parity checking unit 460 sequentially and repeatedly perform operations and perform decoding calculation until the decoding stop condition is satisfied.

However, as the determination result of the parity checking unit 460, when it is determined that the decoding stop condition is satisfied, all decoding calculations are terminated.

According to an embodiment of the present invention, check nodes are partially inactivated in consideration of inactivated variable node to reduce computational load required for check node update, thereby reducing LDPC decoding computational load while minimizing reduction in bit error ratio performance.

The embodiments of the present invention may be written as computer programs and can be implemented in general-use digital computers that execute the programs using a computer readable recording medium.

Examples of the computer readable recording medium include magnetic storage media (e.g., ROMs, floppy disks, hard disks, etc.) and optical recording media (e.g., CD-ROMs, or DVDs).

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of decoding a low-density parity-check code (LDPC) by a processor in an apparatus for performing the same, comprising:
   an initialization process of initializing a plurality of check nodes and a plurality of variable nodes by initializing check-variable messages and variable-check messages, both of which are for calculating the check nodes and the variable nodes,
   a check node update process of updating the check nodes using the variable-check messages,
   a variable node update process of updating the variable nodes using initial values of the variable-check messages and the check-variable messages,
   a tentative decoding process of performing tentative decoding using the initial values of the variable-check messages and the check-variable messages, and
   a parity check process of determining whether a decoding stop condition is satisfied using results of the tentative decoding and a parity check matrix which represents the connectivity between the plurality of check nodes and the plurality of variable nodes, wherein:
   the method further comprises detecting at least one inactive variable nodes using the results of the tentative decoding and a threshold value among the variable nodes between the initialization process and the check node update process;
   the variable node update process is performed only on active variable nodes except for the inactive variable node; and
   the check node update process is performed only using the active variable nodes; and
   the method is implemented as a computer readable code in a data storage device.

2. The method according to claim 1, wherein the check node update process is performed using a less number of active variable nodes as a number of times of the check node update is increased.

3. The method according to claim 1, wherein the variable node update process is performed only on a less number of active variable nodes as a number of times of the variable node update is increased.

4. The method according to claim 1, wherein the check node update process updates the check-variable message using only the active variable nodes except for the inactive variable node and the $j^{th}$ variable node during updating of a check-variable message transmitted to the $j^{th}$ variable node by an $i^{th}$ check node.

5. The method according to claim 1, wherein the check node update process is performed according to Expression 9 below:

$$\alpha_{ij} = \left\{ \prod_{j' \in V(i) \backslash j} \text{sign}(\beta_{ij'}) \right\} \times \min_{j'' \in V(i) \backslash \{j,k\}} (|\beta_{ij''}|) \qquad \text{[Expression 9]}$$

where $\alpha_{ij}$ represents a check-variable message transmitted to a jth variable node by an ith check node, $V(i)\backslash j$ represents a set of the remaining variable nodes except for the jth variable node connected to the ith check node, $V(i)\backslash\{j,k\}$ represents a set of the remaining variable nodes except for a jth variable node connected to an ith check node and a kth variable node as an inactive variable node, $\beta_{ij'}$ is a variable-check message that is transmitted to an ith check node by the remaining variable nodes except for a jth variable node, and $\beta_{ij''}$ represents a variable-check message transmitted to an ith check node by the remaining variable nodes except for a jth variable node and a kth variable node as an inactive variable node.

6. The method according to claim 1, wherein the detecting of the at least one inactive variable node is performed based whether a forced convergence condition is satisfied.

7. An apparatus for decoding a low-density parity-check code (LDPC) comprising:
an initialization unit for performing initialization of a plurality of check nodes and a plurality of variable nodes by initializing check-variable messages and variable-check messages which are used for calculating the check nodes and the variable nodes,
a check node updating unit for performing check node update using the variable-check messages,
a variable node updating unit for performing variable node update using initial values of the variable-check messages and the check-variable messages,
a tentative decoding unit for performing tentative decoding using the initial values of the variable-check messages and the check-variable messages, and
a parity checking unit for performing parity check by determining whether a decoding stop condition is satisfied using results of the tentative decoding and a parity check matrix which represents the connectivity between the plurality of check nodes and the plurality of variable nodes,
wherein:
the apparatus further comprises an inactive node detector for detecting at least one inactive variable nodes using the results of the tentative decoding and a threshold value among the variable nodes;
the variable node updating unit performs the variable node update only on active variable nodes except for inactive variable node; and
the check node updating unit performs the check node update only using the active variable nodes.

8. The apparatus according to claim 7, wherein the check node updating unit performs the check node update using a less number of active variable nodes as a number of times of the check node update is increased.

9. The apparatus according to claim 7, wherein the variable node updating unit performs the variable node update only on a less number of active variable nodes as a number of times of the variable node update is increased.

10. The apparatus according to claim 7, wherein the check node updating unit updates the check-variable message using only the active variable nodes except for the inactive variable node and the jth variable node during updating of a check-variable message transmitted to the jai variable node by an ith check node.

11. The apparatus according to claim 7, wherein the check node updating unit performs the check node update according to Expression 9 below:

$$\alpha_{ij} = \left\{ \prod_{j' \in V(i) \setminus j} \text{sign}(\beta_{ij'}) \right\} \times \min_{j'' \in V(i) \setminus \{j,k\}} (|\beta_{ij''}|) \qquad \text{[Expression 9]}$$

where $\alpha_{ij}$ represents a check-variable message transmitted to a jth variable node by an ith check node, $V(i) \setminus j$ represents a set of the remaining variable nodes except for the jth variable node connected to the ith check node, $V(i) \setminus \{i,k\}$ represents a set of the remaining variable nodes except for a jth variable node connected to an ith check node and a kth variable node as an inactive variable node, $\beta_{ij'}$ is a variable-check message that is transmitted to an ith check node by the remaining variable nodes except for a jth variable node, and $\beta_{ij''}$ represents a variable-check message transmitted to an ith check node by the remaining variable nodes except for a jth variable node and a kth variable node as an inactive variable node.

12. The apparatus according to claim 7, wherein the inactive 5 node detector detects the at least one inactive variable node based whether a forced convergence condition is satisfied.

* * * * *